(12) United States Patent
Usami et al.

(10) Patent No.: US 10,739,681 B2
(45) Date of Patent: Aug. 11, 2020

(54) IMAGE EXPOSURE DEVICE AND IMAGE EXPOSURE METHOD

(71) Applicant: FUJIFILM Corporation, Tokyo (JP)

(72) Inventors: Yoshihisa Usami, Kanagawa (JP); Shinichiro Sonoda, Kanagawa (JP); Hirotoshi Yoshizawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/807,325

(22) Filed: Mar. 3, 2020

(65) Prior Publication Data

US 2020/0201187 A1 Jun. 25, 2020

Related U.S. Application Data (63) Continuation of application No. PCT/JP2018/034459, filed on Sep. 18, 2018.

(30) Foreign Application Priority Data

Sep. 21, 2017 (JP) .................................. 2017-181422

(51) Int. Cl.
G03B 27/52 (2006.01)
G03F 7/20 (2006.01)

(52) U.S. Cl.
CPC ......... *G03F 7/2008* (2013.01); *G03B 27/522* (2013.01)

(58) Field of Classification Search
CPC ..... G03F 7/7008; G03B 27/522; G03B 27/32; G03B 27/0172
USPC ............................................ 349/111; 355/67
See application file for complete search history.

(56) References Cited

U.S. PATENT DOCUMENTS

| 5,161,043 A * | 11/1992 | Narutaki ........... G02F 1/133512 |
| | | 349/111 |
| 5,970,215 A | 10/1999 | Stephenson |
| 6,812,966 B1 | 11/2004 | Nakazawa |
| 9,126,396 B2 * | 9/2015 | Degani ................... B41F 17/00 |

(Continued)

FOREIGN PATENT DOCUMENTS

| JP | H10104752 A | 4/1998 |
| JP | H10309829 A | 11/1998 |

(Continued)

OTHER PUBLICATIONS

International Search Report issued in PCT/JP2018/034459; dated Nov. 20, 2018.

(Continued)

*Primary Examiner* — Hung Nguyen
(74) *Attorney, Agent, or Firm* — Studebaker & Brackett PC (57) ABSTRACT

An image exposure device (10) includes an image display device (20) having a pixel (21), a photosensitive recording medium support portion that supports a photosensitive recording medium (40) in which an image of the image display device (20) is recorded in a state in which an exposure surface (40A) of the photosensitive recording medium (40) faces the image display device (20), a collimation portion (50) that is provided between the image display device (20) and the photosensitive recording medium (40) and makes light from the pixel (21) into parallel light, and an absorption layer (60) that is provided between the image display device (20) and the photosensitive recording medium (40) and has a light transmittance for the light from the pixel (21) of 50% or less.

11 Claims, 7 Drawing Sheets

(56) References Cited

U.S. PATENT DOCUMENTS

2002/0196516 A1* 12/2002 Hira .................. H04N 5/66
359/237
2003/0007068 A1   1/2003 Miyagawa
2003/0128399 A1   7/2003 Chino et al.

FOREIGN PATENT DOCUMENTS

| JP | 2000075243 A | 3/2000 |
| JP | 2001045342 A | 2/2001 |
| JP | 2002341459 A | 11/2002 |
| JP | 2003015087 A | 1/2003 |
| JP | 2003162007 A | 6/2003 |
| JP | 2004291298 A | 10/2004 |

OTHER PUBLICATIONS

International Preliminary Report on Patentability issued in PCT/JP2018/034459; completed Mar. 25, 2019.

* cited by examiner

IMAGE EXPOSURE DEVICE AND IMAGE EXPOSURE METHOD

CROSS-REFERENCE TO RELATED APPLICATIONS

The present application is a Continuation of PCT International Application No. PCT/JP2018/034459 filed on Sep. 18, 2018 claiming priorities under 35 U.S.C § 119(a) to Japanese Patent Application No. 2017-181422 filed on Sep. 21, 2017. Each of the above applications is hereby expressly incorporated by reference, in its entirety, into the present application.

BACKGROUND OF THE INVENTION

1. Field of the Invention

The present invention relates to an image exposure device and an image exposure method and relates to an image exposure device and an image exposure method for recording an image in a photosensitive recording medium.

2. Description of the Related Art

In recent years, a variety of studies regarding a device for exposing a display image of an image display device such as a light-emitting display screen to a photosensitive recording medium such as an instant film have been underway.

For example, U.S. Pat. No. 9,126,396B discloses a device in which a collimation layer is disposed between a light-emitting display screen and an instant film. In U.S. Pat. No. 9,126,396B, the collimation layer blocks unparallel light from the light-emitting display screen, and thus it is possible to remove the necessity for a lens or the like in the device.

SUMMARY OF THE INVENTION

However, in the device of U.S. Pat. No. 9,126,396B, light from the light-emitting display screen is slightly reflected by the collimation layer. The reflected light is further reflected or diffusely reflected by an optical system in the device and turns into unintended light referred to as stray light. In a case where the stray light reaches the instant film during exposure, there is a concern that an image may be overexposed and blurred and the image quality may degrade. Even in a case where the stray light attributed to the light reflected by the collimation layer is weak, in a highly sensitive instant film, the ratio between the light amount of the stray light and the light amount of light transmitted from the light-emitting display screen affects the image quality.

The present invention has been made in consideration of the above-described circumstance, and an object of the present invention is to provide an image exposure device and an image exposure method capable of suppressing the degradation of image quality attributed to stray light.

In order to attain the object of the present invention, a first form of an image exposure device comprises an image display device having pixels; a photosensitive recording medium support portion that supports a photosensitive recording medium for recording an image of the image display device in a state in which an exposure surface of the photosensitive recording medium faces the image display device; a collimation portion that is provided between the image display device and the photosensitive recording medium support portion and makes light from the pixels into parallel light; and an absorption layer that is provided between the image display device and the photosensitive recording medium support portion and has a light transmittance for the light from the pixels of 50% or less.

In a second form of the image exposure device, the absorption layer is a neutral density filter.

In a third form of the image exposure device, the collimation portion is at least one selected from a slit, a fiber optic plate, a capillary plate, or a light control portion formed by laminating three or more layers of transmission members having a plurality of openings.

In a fourth form of the image exposure device, the light transmittance of the absorption layer is 20% or less.

In a fifth form of the image exposure device, the light transmittance of the absorption layer is 0.001% or more.

In a sixth form of the image exposure device, in a case where an amount of light directly reaching a location of the exposure surface of the photosensitive recording medium supported by the photosensitive recording medium support portion from the image display device is represented by A, and an amount of light indirectly reaching the location of the exposure surface of the photosensitive recording medium from the image display device is represented by B, B/A is 1/10,000 or less.

In a seventh form of the image exposure device, the image display device has two-dimensionally arrayed pixels and the image exposure device exposes an entire two-dimensional region of the exposure surface of the photosensitive recording medium at the same time.

In an eighth form of the image exposure device, the image display device has one-dimensionally arrayed pixels, and the image exposure device further comprises a scanning portion that scans at least any one of the image display device or the photosensitive recording medium supported by the photosensitive recording medium support portion in a direction perpendicular to an array direction of the pixels of the image display device.

In a ninth form of the image exposure device, the image display device has two-dimensionally arrayed pixels on a region having a smaller area than the exposure surface of the photosensitive recording medium, and the image exposure device further comprises a scanning portion that scans at least any one of the image display device or the photosensitive recording medium supported by the photosensitive recording medium support portion along both an array direction of the pixels of the image display device and a direction perpendicular to the array direction of the pixels.

In a tenth form of the image exposure device, among exposure ranges to light from the pixels, adjacent exposure ranges partially overlap each other.

In an eleventh form of the image exposure device, the image display device is attachable and detachable.

A twelfth form of an image exposure method comprises a step of preparing an image display device having pixels; a step of preparing a photosensitive recording medium support portion that supports a photosensitive recording medium for recording an image of the image display device in a state in which an exposure surface of the photosensitive recording medium faces the image display device; and a step of exposing the photosensitive recording medium to light from the image display device through a collimation portion that is provided between the image display device and the photosensitive recording medium support portion and makes light from the pixels into parallel light; and an absorption layer that is provided between the image display device and the photosensitive recording medium support portion and has a light transmittance for the light from the pixels of 50% or less.

According to the present invention, it is possible to reduce the occurrence of blurring of an image attributed to stray light and suppress the degradation of image quality.

DESCRIPTION OF THE PREFERRED EMBODIMENTS

Hereinafter, preferred embodiments of the present invention will be described according to the accompanying drawings. The present invention will be described using preferred embodiments below. The embodiments can be modified using a number of methods within the scope of the present invention, and embodiments other than the embodiments can be used. Therefore, all modifications within the scope of the present invention are included in the scope of claims.

Figure 1:
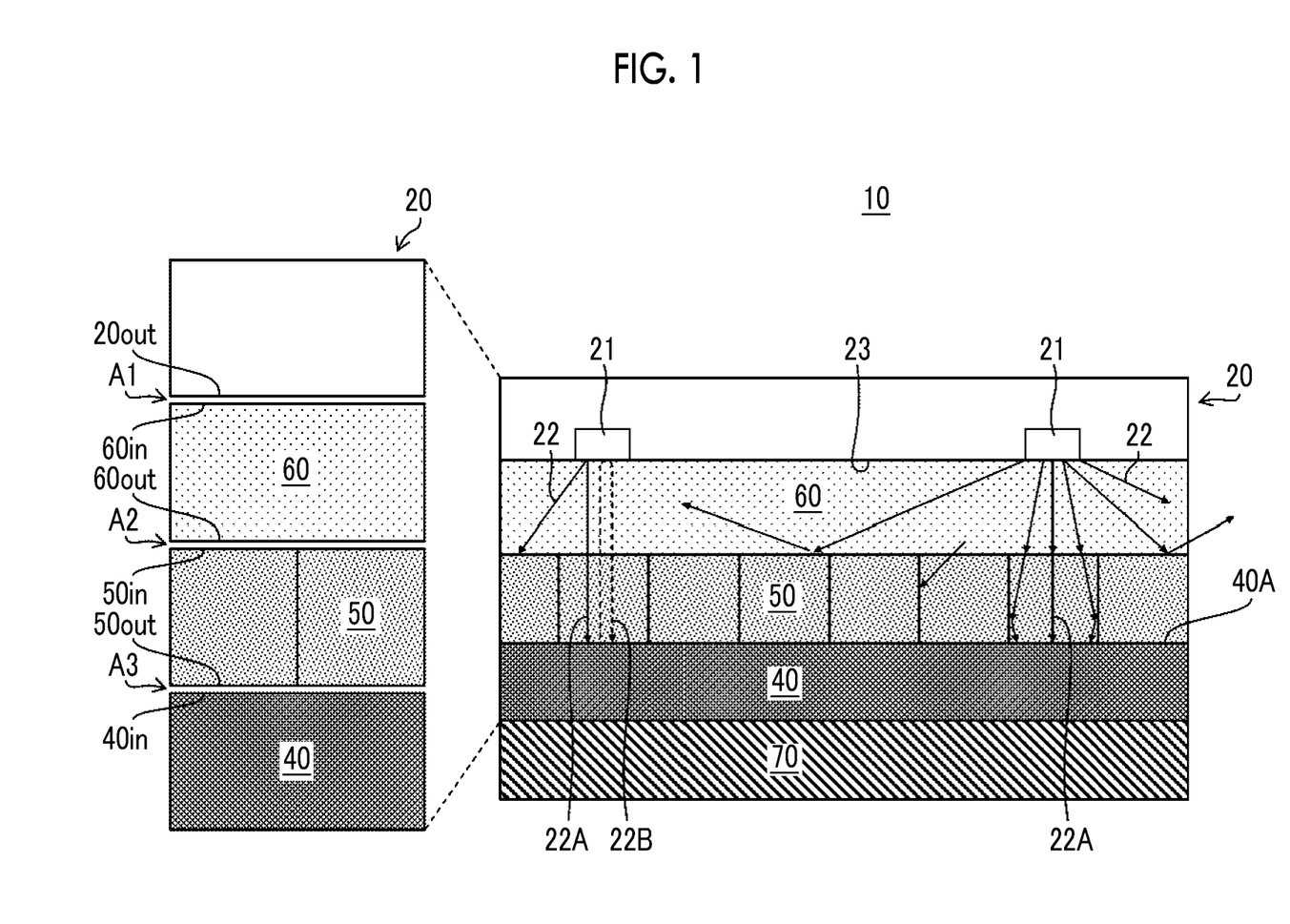
FIG. 1 is a view for describing a principle of the present invention.

A principle of the present invention will be described with reference to FIG. 1. As shown in FIG. 1, an image exposure device 10 includes an image display device 20 and a photosensitive recording medium support portion 70 that supports a photosensitive recording medium 40. The photosensitive recording medium support portion 70 may directly or indirectly support the photosensitive recording medium 40.

The image display device 20 includes a pixel 21. Light 22 from the pixel 21 is radiated from an image display surface 23 of the image display device 20. The pixel 21 refers to a minimum unit of color information configuring the image display surface 23. The image display device 20 has the pixel 21 and is thus capable of displaying an image.

The image display device 20 preferably includes a plurality of the pixels 21 in order to display an image. As the image display device 20 having the pixels 21, a liquid crystal display (LCD) device, an organic light emitting diode (OLED) display device, a plasma display device, a light emitting diode (LED) display device, a cathode ray tube (CRT) display device, or the like can be applied.

However, the image display device 20 is not limited to the above-described structure as long as the pixels 21 are capable of displaying any color information and capable of displaying an image.

Here, the pixel 21 refers, for example, not only to the pixel 21 through which light from a backlight unit is radiated as in a liquid crystal display device but also to the pixel 21 that radiates light on its own as in an organic light emitting diode display device.

The image display surface 23 of the image display device 20 may have the pixels 21 that are two-dimensionally arrayed or the pixels 21 that are one-dimensionally arrayed.

In addition, the two-dimensional image display surface 23 may have a rectangular shape or a non-rectangular shape in a plan view.

The photosensitive recording medium support portion 70 supports the photosensitive recording medium 40 so that the photosensitive recording medium 40 is disposed at a location facing the image display surface 23 of the image display device 20. The structure of the photosensitive recording medium support portion 70 is not particularly limited as long as the photosensitive recording medium support portion is capable of supporting the photosensitive recording medium 40.

The photosensitive recording medium 40 is not particularly limited as long as the photosensitive recording medium can be exposed to parallel light 22A that has passed through an absorption layer 60 and a collimation portion 50 and is capable of forming an image.

The photosensitive recording medium 40 is configured with, for example, a support and a photosensitive material provided on the support. The photosensitive recording medium 40 has an exposure surface 40A. As the photosensitive recording medium 40, any photosensitive recording medium can be used as long as the photosensitive recording medium is a photosensitive product such as a photograph film, a dry plate, photographic printing paper or blueprint, positive paper, a wet plate for platemaking, a photoresist, or an instant film. An instant film is preferably applied.

The collimation portion 50 is provided between the image display device 20 and the photosensitive recording medium support portion 70 supports the photosensitive recording medium 40. The collimation portion 50 makes the light 22 from the pixel 21 into the parallel light 22A. The collimation portion 50 passes the parallel light 22A in the light 22 onto the photosensitive recording medium 40 (refer to the pixel 21 on the left side in FIG. 1).

The collimation portion 50 causes the parallel light 22A in the light 22 to reach the photosensitive recording medium 40. The photosensitive recording medium 40 is exposed to the parallel light 22A. The parallel light 22A is radiated to the exposure surface 40A of the photosensitive recording medium 40 by the collimation portion 50, and thus the occurrence of blurring or the like in an image that is formed on the photosensitive recording medium 40 is reduced, and the degradation of image quality is suppressed. The collimation portion 50 prevents the exposure surface 40A of the photosensitive recording medium 40 from being exposed to light other than the parallel light 22A which causes the blurring of an image.

The parallel light 22A refers to the fact that light rays that have passed through the collimation portion 50 and have been radiated to the exposure surface 40A of the photosensitive recording medium 40 are parallel to each other. Here, the "parallel light" also refers to "light rays being substantially parallel to each other" and means that light rays are parallel enough to prevent the occurrence of blurring of an image that is formed on the photosensitive recording medium 40.

In the image exposure device 10 shown in FIG. 1, the parallel light 22A also refers to light that is orthogonal or substantially orthogonal to the image display surface 23 of the image exposure device 10.

As long as light rays that are radiated to the exposure surface 40A of the photosensitive recording medium 40 are parallel to each other and the blurring of an image can be suppressed, the parallel light 22A may be light inclined at a predetermined angle with respect to the image display surface 23 of the image exposure device 10. In a case where light inclined at a predetermined angle reaches the exposure surface 40A of the photosensitive recording medium 40 and the other light does not reach the exposure surface 40A of the photosensitive recording medium 40, the light inclined at a predetermined angle acts as the parallel light.

The structure of the collimation portion 50 is not particularly limited as long as the collimation portion is capable of making the light 22 from the pixels 21 the parallel light 22A. For example, at least one selected from a slit, a fiber optic plate, a capillary plate, or a light control portion formed by laminating three or more layers of a transmission member having a plurality of openings can be applied.

The slit (referred to as louver) is configured with a plurality of light transmission parts and a light absorption body for preventing light from reaching an adjacent space. The fiber optic plate is a plate including a plurality of two-dimensionally arrayed optical fibers for transferring light and a glass absorber that absorbs light leaking from the optical fibers. The capillary plate is a plate formed of an aggregate of a plurality of two-dimensionally arrayed capillaries having a hole of several tens of micrometers or less.

The light control portion formed by laminating three or more layers of a transmission member having a plurality of openings is a laminate having three or more layers of a parallax barrier laminated together. The parallax barrier is a light-shielding layer having an opening portion for controlling a light-traveling direction.

The image exposure device 10 includes the collimation portion 50, and thus it is possible to remove the necessity for an optical system such as a lens for forming an image of light from the image exposure device 10 on the photosensitive recording medium 40.

The absorption layer 60 is provided between the image display device 20 and the photosensitive recording medium 40. In FIG. 1, the absorption layer 60 is disposed between the image display device 20 and the collimation portion 50. The absorption layer 60 can be provided between the photosensitive recording medium 40 and the collimation portion 50. The light transmittance of the absorption layer 60 for light from the pixels 21 is 50% or less in a wavelength range that is used for exposure. The wavelength range that is used for exposure is preferably a range of 400 nm or more and 700 nm or less that is the visible light range.

The light transmittance of the absorption layer 60 can be obtained using a ratio ($T=I/I_0$ (%)) between an amount $I_0$ of light incident on the absorption layer 60 and an amount I of light transmitted through the absorption layer 60. In a case where the light transmittance of the absorption layer 60 varies depending on wavelengths in the wavelength range that is used for exposure, an average light transmittance is preferably obtained. The average light transmittance can be obtained using average values of the light transmittances at predetermined intervals (for example, every 10 nm) in a range of 400 nm to 700 nm.

The absorption layer 60 is preferably a neutral density (hereinafter, abbreviated as ND) filter. The ND filter refers to a filter having a neutral optical density and is a filter capable of evenly absorbing light (at an absorbance of 50% or more and 99.999% or less; at a light transmittance of 0.001% or more and 50% or less) without affecting wavelengths in the wavelength range that is used for exposure. The ND filter is capable of evenly absorbing light in the wavelength range that is used for exposure and is thus capable of reducing the influence of stray light as described below.

There are two kinds of the ND filter, an absorption-type filter and a reflection-type filter. Stray light is attributed to reflected light, and thus the absorption-type ND filter capable of suppressing reflected light is more preferred than the reflection-type ND filter. The ND filter can be produced by mixing an absorbing colorant into a support or can be produced by applying a transparent material into which a colorant is mixed to a support.

The characteristic of the ND filter is generally defined by the optical density (OD). The optical density OD and a light transmittance T have a relationship of $OD=\log_{10}(1/T)$ (here, $T \leq 1$). In a case where OD is set to 0.3, the light transmittance $T=1/10^{0.3}=50\%$. In the case of using the ND filter as the absorption layer 60, the absorption layer 60 having a desired light transmittance can be easily obtained.

The ND filter has been exemplified as the absorption layer 60, but the absorption layer is not particularly limited as long as the light transmittance for light from the pixels 21 is 50% or less in the wavelength range that is used for exposure.

Next, an action of the absorption layer 60 provided in the image exposure device 10 of an embodiment of the present invention capable of reducing the influence of stray light will be described with reference to FIG. 1.

Here, stray light 22B refers to light indirectly reaching the photosensitive recording medium 40 from the image display device 20 and refers to, in light reflected by the photosensitive recording medium 40, light that is reflected by the image display device 20, the collimation portion 50, or the like and, again, reaches the photosensitive recording medium 40.

As shown in FIG. 1, the image exposure device 10 includes the image display device 20, the absorption layer 60, the collimation portion 50, and the photosensitive recording medium support portion 70 that supports the photosensitive recording medium 40 in this order. The light 22 radiated from the image display device 20 passes through the absorption layer 60 and the collimation portion 50 (refer to the pixel 21 on the left side in FIG. 1). The light 22 is made to be the parallel light 22A by the collimation portion 50, and the parallel light 22A is radiated to the exposure surface 40A of the photosensitive recording medium 40 supported by the photosensitive recording medium support portion 70.

In the image exposure device 10, an optical adhesive or the like is not used. Therefore, an air layer A1 is present between the image display device 20 and the absorption layer 60, an air layer A2 is present between the absorption layer 60 and the collimation portion 50, and an air layer A3 is present between the collimation portion 50 and the photosensitive recording medium 40.

The refractive indexes of the air layer A1, the air layer A2, and the air layer A3 are one. The refractive index of each of the image display device 20, the absorption layer 60, the collimation portion 50, and the photosensitive recording medium 40 is approximately 1.5. Therefore, in an exit surface $20_{out}$ that is an interface between the image display device 20 and the air layer A1, light is reflected. Similarly, in an incident surface $60_{in}$ that is an interface between the air layer A1 and the absorption layer 60, in an exit surface $60_{out}$ that is an interface between the absorption layer 60 and the air layer A2, in an incident surface $50_{in}$ that is an interface between the air layer A2 and the collimation portion 50, in an exit surface $50_{out}$ that is an interface between the collimation portion 50 and the air layer A3, and, in an incident surface $40_{in}$ that is an interface between the air layer A3 and the photosensitive recording medium 40, light is reflected.

Here, the incident surface and the exit surface are defined on the basis of a direction of light being radiated from the image display device 20 toward the photosensitive recording medium 40 for convenience. In the case of using the direction of light being radiated from the photosensitive recording medium 40 toward the image display device 20 as the basis, the incident surface and the exit surface are expressed as the exit surface and the incident surface.

Generally, in a case where the refractive index of a medium A is represented by $n_a$, and the refractive index of a medium B is represented by $n_b$, a reflectivity $R_{ref}$ of an interface between the medium A and the medium B is obtained using the following expression.

$$R_{ref} = \left[\frac{n_a - n_b}{n_a + n_b}\right]^2$$

In a case where the matrix A is the air layers A1, A2, and A3, $n_a$ reaches one. In a case where the matrix B is the image display device 20, the absorption layer 60, the collimation portion 50, and the photosensitive recording medium 40, $n_b$ reaches 1.5.

In the image exposure device 10 shown in FIG. 1, $R_{ref}$ is obtained to be 4(%) from Expression 1. The light transmittance of the absorption layer 60 was set to 50%, and the light amounts of the parallel light 22A and the stray light 22B in the light 22 from the image display device 20 which reached the exposure surface 40A of the photosensitive recording medium 40 were calculated. The calculation results are summarized in Table 1.

Finally, 4% of the 42.5% of the light is reflected by the incident surface $40_{in}$ of the photosensitive recording medium 40. 40.8% of the light is incident on the collimation portion 50 from the incident surface $40_{in}$ of the photosensitive recording medium 40 and used to expose the photosensitive recording medium 40.

Meanwhile, 1.7% of the light corresponding to 4% of the 42.5% of the light is radiated toward the collimation portion 50 from the incident surface $40_{in}$ of the photosensitive recording medium 40 as reflected light.

4% of the 1.7% of the reflected light is reflected by the exit surface $50_{out}$ of the collimation portion 50. 1.63% of the reflected light is incident on the collimation portion 50 from the exit surface $50_{out}$ of the collimation portion 50. 4% of the 1.63% of the reflected light that has passed through the collimation portion 50 is reflected by the incident surface $50_{in}$ of the collimation portion 50. As a result, 1.57% of the reflected light is radiated toward the absorption layer 60 from the incident surface $50_{in}$ of the collimation portion 50.

4% of the 1.57% of the reflected light is reflected by the exit surface $60_{out}$ of the absorption layer 60. 1.50% of the reflected light is incident on the absorption layer 60 from the exit surface $60_{out}$ of the absorption layer 60. 4% of the 1.50% of the reflected light that has passed through the absorption layer 60 is reflected by the incident surface $60_{in}$ of the absorption layer 60, and, furthermore, 50% of the reflected light is absorbed by the absorption layer 60. As a

TABLE 1

| Structure | Light transmittance | Refractive index | Interface | Reflectivity | Transmitted light | Reflected light | Stray light |
|---|---|---|---|---|---|---|---|
| Image display device | — | 1.5 | Exit surface | 4.0% | 100.0% | 0.03% | |
| Absorption layer | 50% | 1.5 | Incident surface | 4.0% | 96.0% | 0.72% | 0.028% |
| | | | Exit surface | 4.0% | 46.1% | 1.50% | 0.013% |
| Collimation portion | — | 1.5 | Incident surface | 4.0% | 44.2% | 1.57% | 0.013% |
| | | | Exit surface | 4.0% | 42.5% | 1.63% | 0.012% |
| Photosensitive recording medium | — | 1.5 | Incident surface | 4.0% | 40.8% | 1.7% | 0.012% |

The respective numerical values will be described with reference to Table 1. 100% of light is radiated from the exit surface $20_{out}$ of the image display device 20. 4% of the 100% of the light is reflected by the incident surface $60_{in}$ of the absorption layer 60. 96% of the light is incident on the absorption layer 60 from the incident surface $60_{in}$ of the absorption layer 60. Transmitted light refers to light that passes through the absorption layer 60 and the collimation portion 50 without being reflected.

4% of the 96% of the light that has passed through the absorption layer 60 is reflected by the exit surface $60_{out}$ of the absorption layer 60, and, furthermore, 50% is absorbed by the absorption layer 60. As a result, 46.1% of the light is radiated from the exit surface $60_{out}$ of the absorption layer 60 toward the collimation portion 50.

4% of the 46.1% of the light is reflected by the incident surface $50_{in}$ of the collimation portion 50. 44.2% of the light is incident on the collimation portion 50 from the incident surface $50_{in}$ of the collimation portion 50.

4% of the 44.2% of the light that has passed through the collimation portion 50 is reflected by the exit surface $50_{out}$ of the collimation portion 50. As a result, 42.5% of the light is radiated from the exit surface $50_{out}$ of the collimation portion 50 toward the photosensitive recording medium 40 as the parallel light 22A.

result, 0.72% of the reflected light is radiated toward the image display device 20 from the incident surface $60_{in}$ of the absorption layer 60.

0.03% of the light corresponding to 4% of the 0.72% of the reflected light is radiated toward the photosensitive recording medium 40 from the exit surface $20_{out}$ of the image display device 20 as stray light. 0.03% of the stray light reaches the photosensitive recording medium 40 through the same light path as the transmitted light.

4% of the 0.03% of the stray light is reflected by the incident surface $60_{in}$ and the exit surface $60_{out}$ of the absorption layer 60 respectively, and 50% of the stray light is absorbed. 0.013% of the stray light from the exit surface $60_{out}$ of the absorption layer 60 is radiated toward the collimation portion 50.

4% of the 0.013% of the stray light is reflected by the incident surface $50_{in}$ and the exit surface $50_{out}$ of the collimation portion 50 respectively. As a result, 0.012% of the reflected light from the exit surface $50_{out}$ of the collimation portion 50 is radiated toward the photosensitive recording medium 40.

This calculation was carried out with an assumption that the refractive indexes of all of the media except for the air layers are set to 1.5 and that the reflectivity of each of the interfaces is set to 4%.

As shown in Table 1, the parallel light 22A that reaches the photosensitive recording medium 40 turns into light having a light amount of 40.8% with respect to the light having a light amount of 100% which is radiated from the exit surface $20_{out}$ of the image display device 20. The reflected light turns into light having a light amount of 1.7% with respect to the light having a light amount of 100%.

1.7% of the reflected light passes through the collimation portion 50 and the absorption layer 60 and is reflected by the exit surface $20_{out}$ of the image display device 20. This light turns into light having a light amount of 0.03% with respect to the light having a light amount of 100%.

Light that is at least not parallel light inclined at an angle is incident on an adjacent or farther photosensitive recording medium 40 and becomes stray light that causes the blurring of an image.

In a case where light orthogonal to the image display surface 23 of the image display device 20 is reflected or the like by the interface, the light reaches the same location of the photosensitive recording medium 40 and thus has a small influence on the blurring of an image. However, this light can also be regarded as a kind of stray light, and the light amount thereof is preferably small.

In a case where the difference between the light amount of the parallel light 22A that is light from the image display device 20 and directly reaches the location of the exposure surface 40A of the photosensitive recording medium 40 supported by the photosensitive recording medium support portion 70 and the light amount of the stray light 22B that is light from the image display device 20 and indirectly reaches the location of the exposure surface 40A of the photosensitive recording medium 40 supported by the photosensitive recording medium support portion 70 is not large, the difference appears as the blurring of an image. The difference between the light amount of the parallel light 22A and the light amount of the stray light 22B can be confirmed using the following ratio.

In the above-described embodiment, the reflected light passes through the absorption layer 60 and the collimation portion 50 and reaches the photosensitive recording medium 40 as stray light. This light turns into light having a light amount of 0.012% with respect to the light having a light amount of 100%.

Therefore, in the embodiment, in a case where the light amount of the parallel light 22A is represented by A and the light amount of the stray light 22B is represented by B, the ratio B/A reaches 0.012/40.8=1/3466.

Generally, in a case where the light amount A of the parallel light 22A and the light amount B of the stray light 22B have a relationship of B/A≥1/1,000, an image is considered to be blurred.

From Table 1, it is possible to understand that the degradation of the image quality such as the blurring of an image can be prevented by providing the absorption layer 60 having a light transmittance of 50% between the image display device 20 and the photosensitive recording medium 40.

As shown in Table 1, the light amount of the parallel light 22A that reaches the exposure surface 40A of the photosensitive recording medium 40 is decreased by 50% by the absorption layer 60. Meanwhile, the reflected light passes through the absorption layer 60 twice, and thus the light amount of the stray light 22B can be decreased by 50%× 50%=25%. Therefore, it is possible to decrease B/A that is the ratio between the light amount A of the parallel light 22A and the light amount B of the stray light 22B.

Next, for a case where the absorption layer 60 is not provided between the image display device 20 and the photosensitive recording medium 40, the light amounts of the parallel light 22A and the stray light 22B in the light 22 from the image display device 20 which reached the photosensitive recording medium 40 were calculated. The calculation results are summarized in Table 2. This calculation was carried out with an assumption that the refractive indexes of the air layers are set to 1, the refractive indexes of all of the media except for the air layers are set to 1.5, and the reflectivity of each of the interfaces is set to 4%.

TABLE 2

| Structure | Light transmittance | Refractive index | Interface | Reflectivity | Transmitted light | Reflected light | Stray light |
|---|---|---|---|---|---|---|---|
| Image display device | — | 1.5 | Exit surface | 4.0% | 100.0% | 0.14% | |
| Collimation portion | — | 1.5 | Incident surface | 4.0% | 96.0% | 3.4% | 0.13% |
| | | | Exit surface | 4.0% | 92.2% | 3.5% | 0.13% |
| Photosensitive recording medium | — | 1.5 | Incident surface | 4.0% | 88.5% | 3.7% | 0.12% |

As shown in Table 2, the parallel light that reaches the exposure surface of the photosensitive recording medium (transmitted light) turns into light having a light amount of 88.5% with respect to the light having a light amount of 100% which is radiated from the exit surface of the image display device. It is possible to understand that the reflected light turns into light having a light amount of 3.7% with respect to the light having a light amount of 100% and light having a light amount of 0.12% reaches the photosensitive recording medium as stray light.

In the case of Table 2, the ratio B/A between the light amount A of the parallel light and the light amount B of the stray light is 0.12/88.5=1/736 which is equal to or more than 1/1,000. In the case of not providing the absorption layer, an image is blurred, and thus it is possible to understand that the quality of an image that is formed on the photosensitive recording medium degrades.

Other than the stray light, there is light reflected by the incident surface and the exit surface of the collimation portion, light that returns to the image display device and is then reflected inside and radiated from the image display device, or the like. There is a concern that 11.5% of the light other than 88.5% of the parallel light reaching the photosensitive recording medium becomes the stray light in the image exposure device and reaches the photosensitive recording medium.

Next, for cases where the absorption layer 60 has a light transmittance of 20% and has a light transmittance of 10%, the light amounts of the parallel light 22A and the stray light 22B which reached the photosensitive recording medium 40 were calculated. Table 3 shows the calculation results of the case with the light transmittance of 20%, and Table 4 shows the calculation results of the case with the light transmittance of 10%.

TABLE 3

| Structure | Light transmittance | Refractive index | Interface | Reflectivity | Transmitted light | Reflected light | Stray light |
|---|---|---|---|---|---|---|---|
| Image display device | — | 1.5 | Exit surface | 4.0% | 100.0% | 0.005% | |
| Absorption layer | 20% | 1.5 | Incident surface | 4.0% | 96.0% | 0.12% | 0.0044% |
| | | | Exit surface | 4.0% | 18.4% | 0.60% | 0.0009% |
| Collimation portion | — | 1.5 | Incident surface | 4.0% | 17.7% | 0.63% | 0.0008% |
| | | | Exit surface | 4.0% | 17.0% | 0.65% | 0.0008% |
| Photosensitive recording medium | — | 1.5 | Incident surface | 4.0% | 16.3% | 0.7% | 0.0008% |

In the case of a form of Table 3, the ratio B/A between the light amount A of the parallel light 22A and the light amount B of the stray light 22B is 0.0008/16.3=1/21,660.

In order to further reliably suppress the degradation of the image quality such as the blurring of an image or the like attributed to the stray light 22B, B/A is preferably equal to or smaller than 1/10,000. In the case of setting the light transmittance of the absorption layer 60 to 20%, it is possible to attain 1/10,000 or less.

In the case of setting the light transmittance of the absorption layer 60 to 29% or less, it is possible to attain B/A≤1/10,000.

The light transmittance of the absorption layer 60 is 0.001% or more, preferably 0.01% or more, more preferably 0.1% or more, and still more preferably 0.5% or more.

In a case where the transmittance is too high, the influence of the stray light is large, and it becomes difficult to suppress the degradation of the image quality. On the other hand, in a case where the transmittance is too low, there is a concern that the exposure time may exceed a realistic length.

Figure 2:
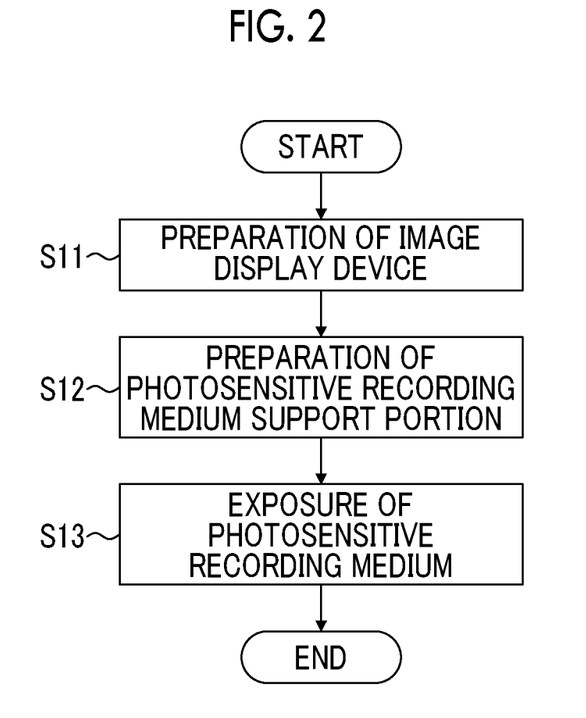
FIG. 2 is a flowchart showing an exposure method of the present invention.

Next, an image exposure method using the image exposure device 10 will be described. FIG. 2 is a flowchart showing an exposure method of the embodiment of the present invention. First, the image display device 20 is

TABLE 4

| Structure | Light transmittance | Refractive index | Interface | Reflectivity | Transmitted light | Reflected light | Stray light |
|---|---|---|---|---|---|---|---|
| Image display device | — | 1.5 | Exit surface | 4.0% | 100.0% | 0.001% | |
| Absorption layer | 10% | 1.5 | Incident surface | 4.0% | 96.0% | 0.03% | 0.001% |
| | | | Exit surface | 4.0% | 9.2% | 0.30% | 0.0001% |
| Collimation portion | — | 1.5 | Incident surface | 4.0% | 8.8% | 0.31% | 0.0001% |
| | | | Exit surface | 4.0% | 8.5% | 0.33% | 0.0001% |
| Photosensitive recording medium | | 1.5 | Incident surface | 4.0% | 8.2% | 0.3% | 0.0001 |

In the case of a form of Table 4, the ratio B/A between the light amount A of the parallel light 22A and the light amount B of the stray light 22B is 0.0001/8.2=1/86,638. Therefore, B/A≤1/10,000 is sufficiently satisfied.

As shown in Table 4, the parallel light 22A reaching the exposure surface 40A of the photosensitive recording medium 40 turns into light having a light amount of 8.2%, approximately 1/10, with respect to the light having a light amount of 100% from the image display device 20. Therefore, the exposure time is extended. On the other hand, the stray light 22B reaching the photosensitive recording medium 40 turns into light having a light amount of 0.0001% which is approximately 1/1,000 in the case of being compared with 0.12% shown in Table 2. Even in a case where the light amount of the parallel light 22A is approximately 8.2%, the sensitivity of the photosensitive recording medium 40 is high, and thus it is possible to expose the exposure surface 40A of the photosensitive recording medium 40 to the parallel light 22A.

From the characteristic values (refractive index, absorbance, and the like) of the image display device 20, the absorption layer 60, the collimation portion 50, and the photosensitive recording medium 40 which configure the image exposure device 10, the ratio of the light amount between the parallel light 22A and the stray light 22B can be easily obtained.

The transmittance of the absorption layer 60 is preferably small, and the transmittance of the absorption layer 60 is 50% or less, preferably 40% or less, preferably 30% or less, more preferably 20% or less, and still more preferably 10% or less.

prepared (Step S11). Next, the photosensitive recording medium support portion 70 that supports the photosensitive recording medium 40 in which an image of the image display device 20 is recorded in a state in which the exposure surface 40A of the photosensitive recording medium 40 faces the image display device 20 is prepared (Step S12). Regarding the order of the preparation of the image display device 20 of Step S11 and the preparation of the photosensitive recording medium support portion 70 of Step S12, any preparation may come first.

Next, the exposure surface 40A of the photosensitive recording medium 40 is exposed to the light from the image display device 20 (Step S13). In Step S13, the photosensitive recording medium 40 is exposed to the light from the image display device 20 through the collimation portion 50 that is provided between the image display device 20 and the photosensitive recording medium support portion 70 and makes light from the pixels into parallel light and the absorption layer 60 that has a light transmittance for light from the pixels of 50% or less.

A case where the absorption layer 60 absorbs and transmits light having any wavelength in the entire wavelength range of the pixels used for exposure has been described. The absorption layer 60 is not limited thereto and is capable of absorbing more light having a wavelength in a specific wavelength range than in other wavelength ranges and decreasing the transmittance in the specific wavelength range.

For example, in a case where there is a difference between the light-emitting spectrum of the image display device 20 and the photosensitive spectrum of the photosensitive recording medium 40, it is also possible to change the transmittance using wavelengths so as to correct the difference. In addition, in a case where the light transmittance of an optical member such as the collimation portion 50 varies depending on wavelengths, the light transmittance can also be corrected.

For example, in a case where the photosensitive recording medium is exposed to light rays having three wavelengths R (Red), G (Green), and B (Blue) and the transmittance of the collimation portion 50 being used is 50% for B and 25% for G and R respectively, the transmittance for all of the light rays having the wavelengths R, G, and B reaches 5% under a condition in which the transmittance of the absorption layer 60 is 10% for B and 20% for G and B respectively.

Next, preferred embodiments of the present invention will be described. In the following embodiments, the configurations of typical image exposure devices will be described. These embodiments are only intended to exemplify the image exposure devices and are not meant to limit the image exposure device described in the present specification.

First Embodiment

Figure 3:
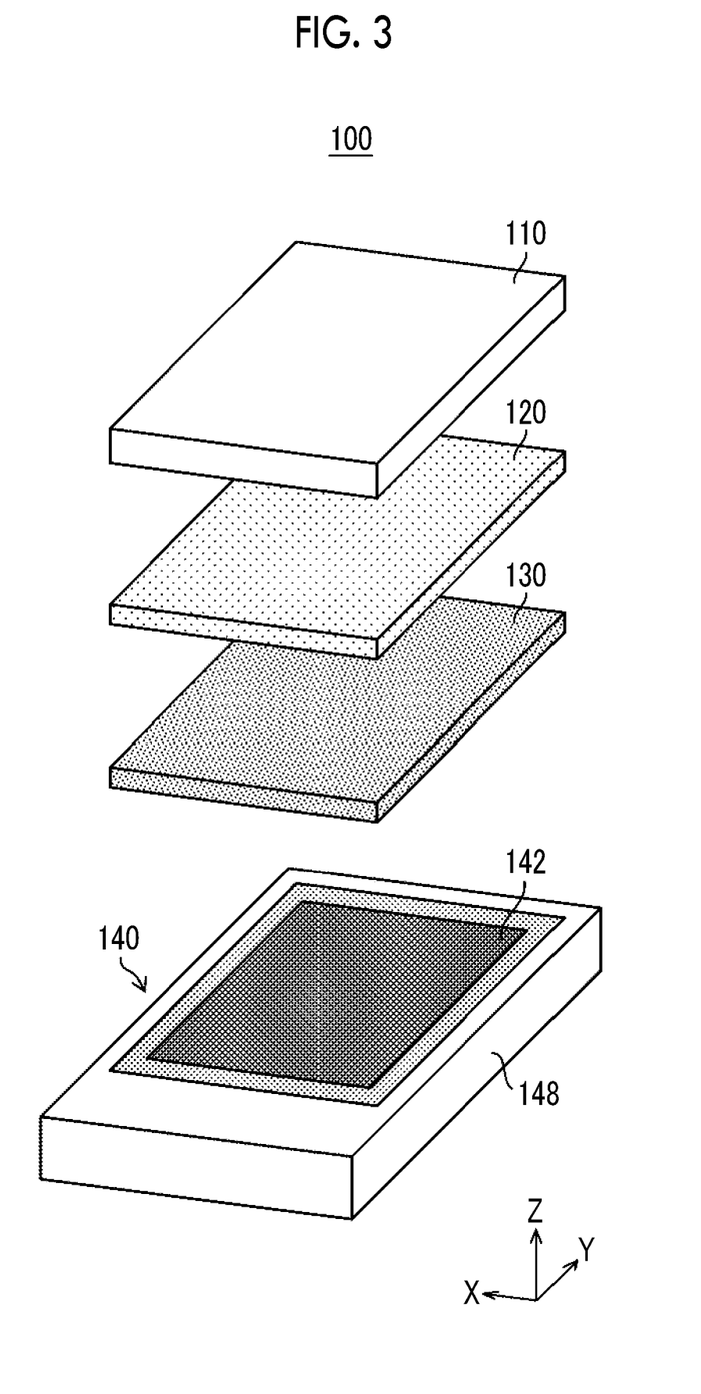
FIG. 3 is an exploded perspective view of an image exposure device of a first embodiment.
Figure 4:
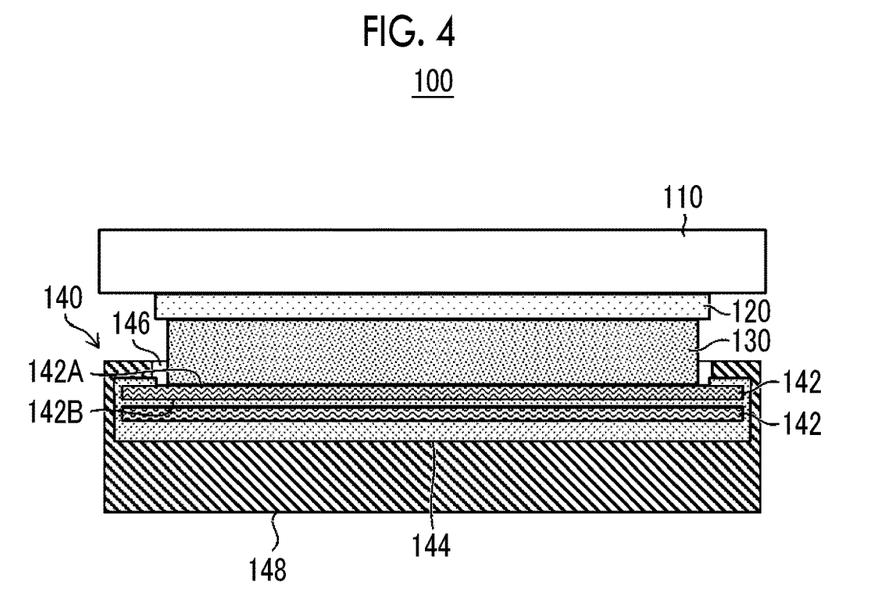
FIG. 4 is a cross-sectional view of the image exposure device of the first embodiment.

FIG. 3 is an exploded perspective view of an image exposure device 100 according to a first embodiment, and FIG. 4 is a cross-sectional view of the image exposure device 100 according to the first embodiment.

As shown in FIG. 3 and FIG. 4, the image exposure device 100 of the first embodiment includes an image display device 110. As shown in FIG. 3, the image display device 110 is two-dimensional. Being two-dimensional means a state in which the device extends in X-Y directions. In the first embodiment, the image display device 110 extends in the X-Y directions. In addition, a plurality of pixels of the image display device 110 is also arrayed two-dimensionally.

As the two-dimensional image display device 110, for example, a portable terminal represented by a smartphone and a tablet PC is applicable. The image display method of the image display device 110 is not limited as long as the image display device is capable of displaying an image, and a structure such as an LCD method or an OLED method is applicable. A glass surface is preferably removed from the image display device.

In the case of the LCD method, the image display device 110 includes a plurality of pixels including, for example, a backlight unit that functions as a light source and a color filter for displaying an image. In order to protect a plurality of pixels, the image display device 110 preferably includes a chassis, a glass surface, and the like.

As shown in FIGS. 3 and 4, the image exposure device 100 includes an ND filter 120 configuring the absorption layer. The ND filter 120 configuring the absorption layer is provided on an image display surface side of the image display device 110. As the ND filter 120, a filter for light amount adjustment for photographic exposure manufactured by Fujifilm Corporation can be used. ND filters being sold by KenkoTokina Corporation, Kodak Japan Ltd., Sigmakoki Co., Ltd. and the like can be used.

In order to obtain a transmittance of 50% or more, an ND filter 120 having an optical density (OD) of 0.3 or more is preferably used. The ND filter 120 has a thickness of, for example, 90 μm±10 μm. The thickness of the ND filter 120 is not limited to this range. The ND filter 120 preferably covers the entire image display surface of the image display device 110.

As shown in FIGS. 3 and 4, the image exposure device 100 includes a fiber optic plate 130 as the collimation portion. The fiber optic plate 130 totally reflects and transmits light incident on an optical fiber. The pitches between optical fibers of the fiber optic plate 130 are preferably equal to or less than the pixel pitches of the image display device 110.

The fiber optic plate 130 preferably covers the entire image display surface of the image display device 110.

As shown in FIGS. 3 and 4, the image exposure device 100 includes a film pack 140 configured with an instant film 142 configuring the photosensitive recording medium and a case 144 that accommodates the instant film 142. A chassis 148 that is the photosensitive recording medium support portion for supporting the film pack 140 is provided. The chassis 148 is capable of attachably and detachably supporting the film pack 140.

The case 144 is capable of accommodating a plurality of the instant films 142. As shown in FIG. 4, in the case 144 and the chassis 148, an opening portion 146 is formed on a side facing the image display device 110.

The instant film 142 has a rectangular card shape. The instant film 142 is configured with an exposure surface 142A on a rear surface side and an observation surface 142B on a front surface side. The exposure surface 142A is a surface on which an image is recorded by exposure using parallel light, and the observation surface 142B is a surface on which the recorded image is observed.

The exposure surface 142A of the instant film 142 has an exposure portion, a pod portion and a trap portion sandwiching the exposure portion (not shown). In the pod portion, a development process liquid pod encapsulating a development process liquid is accommodated. In the trap portion, an absorbent is accommodated.

The instant film 142 is developed by delivering the development process liquid in the pod portion to the exposure portion after exposure. The development process liquid in the pod portion is extracted from the pod portion and delivered to the exposure portion by passing the instant film 142 between a pair of rollers (not shown). The development process liquid left over during the delivery process is trapped in the trap portion.

In the first embodiment, the image display device 110 has two-dimensionally arrayed pixels extending in the X-Y directions. The image display surface of the image display device 110 is substantially as large as the ND filter 120, the fiber optic plate 130, and the two-dimensional exposure surface of the instant film 142. Therefore, it is possible to expose the entire two-dimensional regions of the exposure surfaces of the instant films 142 to an image from the image display device 110 at the same time.

An image needing to be exposed is displayed on the image display device 110. Light from the pixels of the image display device 110 passes through the ND filter 120 and the fiber optic plate 130 and turns into parallel light. This parallel light reaches the exposure surfaces 142A of the instant films 142 and can be used to expose the instant films 142 at the same time. The entire two-dimensional region of the exposure surface may be exposed at the same time by, for example, arraying a plurality of image display devices having one-dimensionally arrayed pixels to form two-dimensionally arrayed pixels and exposing the exposure surface at the same time.

The ND filters 120 significantly reduces stray light that reaches the exposure surfaces 142A of the instant films 142. After exposure, a development process is carried out on the instant films 142. It is possible to easily understand from the above-described principle that, on the instant film 142, an image that is rarely blurred is formed and the degradation of the image quality is suppressed.

A shutter mechanism can be provided to the image display device 110 by controlling the time of displaying an image on the image display device 110. In addition, it is also possible to provide a shutter mechanism between the image display device 110 and the instant film 142.

In a case where the image display device 110 is a portable terminal, the image display device 110 is preferably attachable to and detachable from the image exposure device 100. The fact that the image display device is attachable to and detachable from the image exposure device means that the image display device can be attached to and detached from the image exposure device. For example, a user of the image display device 110 acquires an image from the image display device 110. The image display device 110 is attached as the configuration of a part of the image exposure device 100. The instant films 142 are exposed using the image of the image display device 110. After exposure, the image display device 110 is detached from the image exposure device 100, and a new image can be acquired from the image display device 110.

Second Embodiment

A second embodiment will be described with reference to FIG. 5. A portion exhibiting the same action as in the above-described first embodiment will be given the same reference sign and not be described in detail, and facts different from other embodiments will be mainly described.

Figure 5:
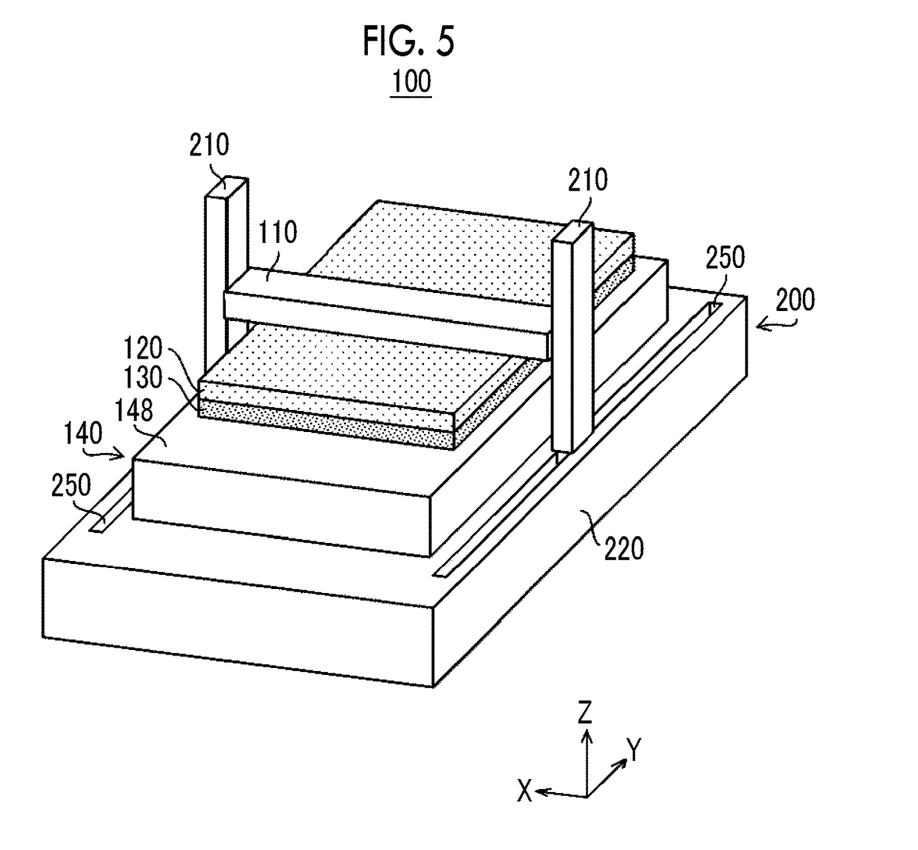
FIG. 5 is a perspective view of an image exposure device of a second embodiment.

As shown in FIG. 5, the image exposure device 100 includes the image display device 110, the ND filter 120, the fiber optic plate 130, and the film pack 140 configured with the case 144 accommodating a plurality of instant films (not shown).

Unlike the first embodiment, the image display device 110 of the second embodiment is one-dimensional. Being one-dimensional means a state in which the device extends in one direction of the X-Y directions. As shown in FIG. 5, the image display device 110 extends in the X direction. The image display device 110 has one-dimensionally arrayed pixels.

The image display device 110 is almost as long as the length in the X direction of the instant film. The image display device 110 is one-dimensional, and thus the length of the image display device 110 in the Y direction is shorter than the length of the instant film in the Y direction. The image display device 110 is smaller than the exposure surface of the instant film.

In the second embodiment, the instant films are exposed, and thus the image display device 110 is scanned in the Y direction that is a direction perpendicular to the X direction that is the array direction of the pixels.

As shown in FIG. 5, the image exposure device 100 includes a scanning portion 200 for scanning the image display device 110. The scanning portion 200 includes support portions 210 that support both ends of the image display device 110, a support table 220 that supports the film pack 140, and a driving portion (not shown) that is accommodated in the support table 220. The support table 220 includes rails 250, and the driving portion is capable of scanning the support portion 210 in the Y direction along the rails 250.

While the scanning portion 200 scans the image display device 110 in the vertical direction, the image display device 110 is capable of sequentially exposing the instant films. A control portion, not shown, is preferably provided in order to synchronize the image displaying of the image display device 110 and the driving of the scanning portion 200.

Light from the pixels of the image display device 110 passes through the ND filter 120 and the fiber optic plate 130 and turns into parallel light. This parallel light reaches the exposure surfaces 142A of the instant films 142 and can be used to sequentially expose the instant films 142.

The ND filter 120 significantly reduces stray light that reaches the exposure surfaces 142A of the instant films 142. After exposure, a development process is carried out on the instant films 142. It is possible to easily understand from the above-described principle that, on the instant film 142, an image that is rarely blurred is formed and the degradation of the image quality is suppressed.

Figure 6:
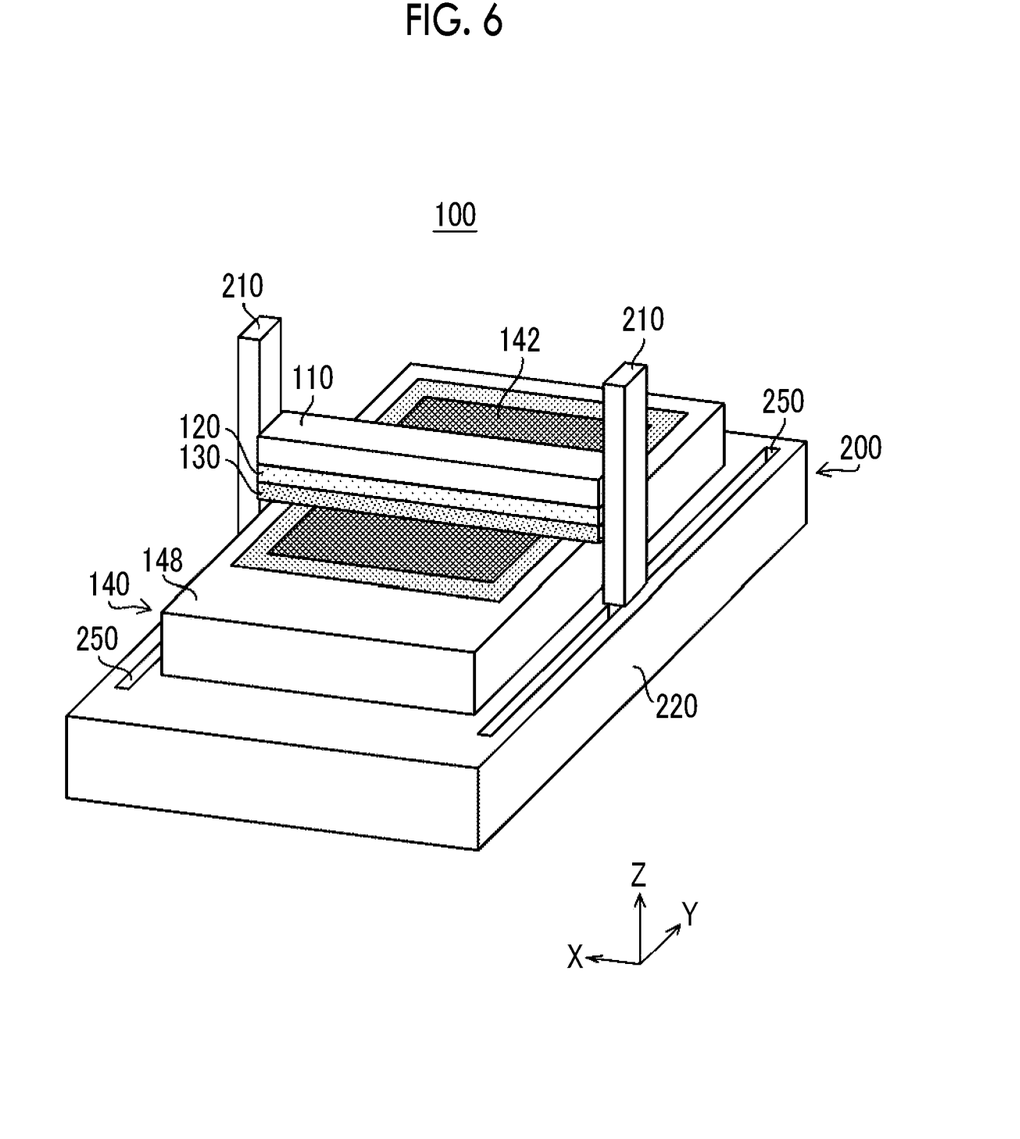
FIG. 6 is a perspective view of a modification example of the image exposure device of the second embodiment.

FIG. 6 shows a modification example of the image exposure device 100 of the second embodiment. The modification example of the image exposure device 100 includes the image display device 110, the ND filter 120, the fiber optic plate 130, and the chassis 148 that attachably and detachably supports the film pack 140 configured with the case 144 accommodating the instant films 142.

In the modification example of the image exposure device 100, the ND filter 120 and the fiber optic plate 130 are configured one-dimensionally so as to extend in the X direction that is the same as the array direction of the pixels of the image display device 110.

While the scanning portion 200 scans the image display device 110, the ND filter 120, and the fiber optic plate 130 in a direction perpendicular to the array direction of the pixels of the image display device 110, the image display device 110 is capable of sequentially exposing the instant films 142.

Light from the pixels of the image display device 110 passes through the ND filter 120 and the fiber optic plate 130 and turns into parallel light. This parallel light reaches the instant films 142 and can be used to sequentially expose the exposure surfaces 142A of the instant films 142.

The ND filter 120 significantly reduces stray light that reaches the exposure surfaces 142A of the instant films 142. After exposure, a development process is carried out on the instant films 142. It is possible to easily understand from the above-described principle that, on the instant film 142, an image that is rarely blurred is formed and the degradation of the image quality is suppressed.

The case of exposing the instant films while scanning the image display device 110 has been described, but the instant films may be exposed while scanning the instant films as long as the image display device 110 and the instant films 142 can be scanned relative to each other. That is, at least one of the image display device 110 or the instant films 142 needs to be scanned.

Third Embodiment

A third embodiment will be described with reference to FIG. 7. A portion exhibiting the same action as in the above-described first embodiment and second embodiment will be given the same reference sign and not be described in detail, and facts different from other embodiments will be mainly described.

Figure 7:
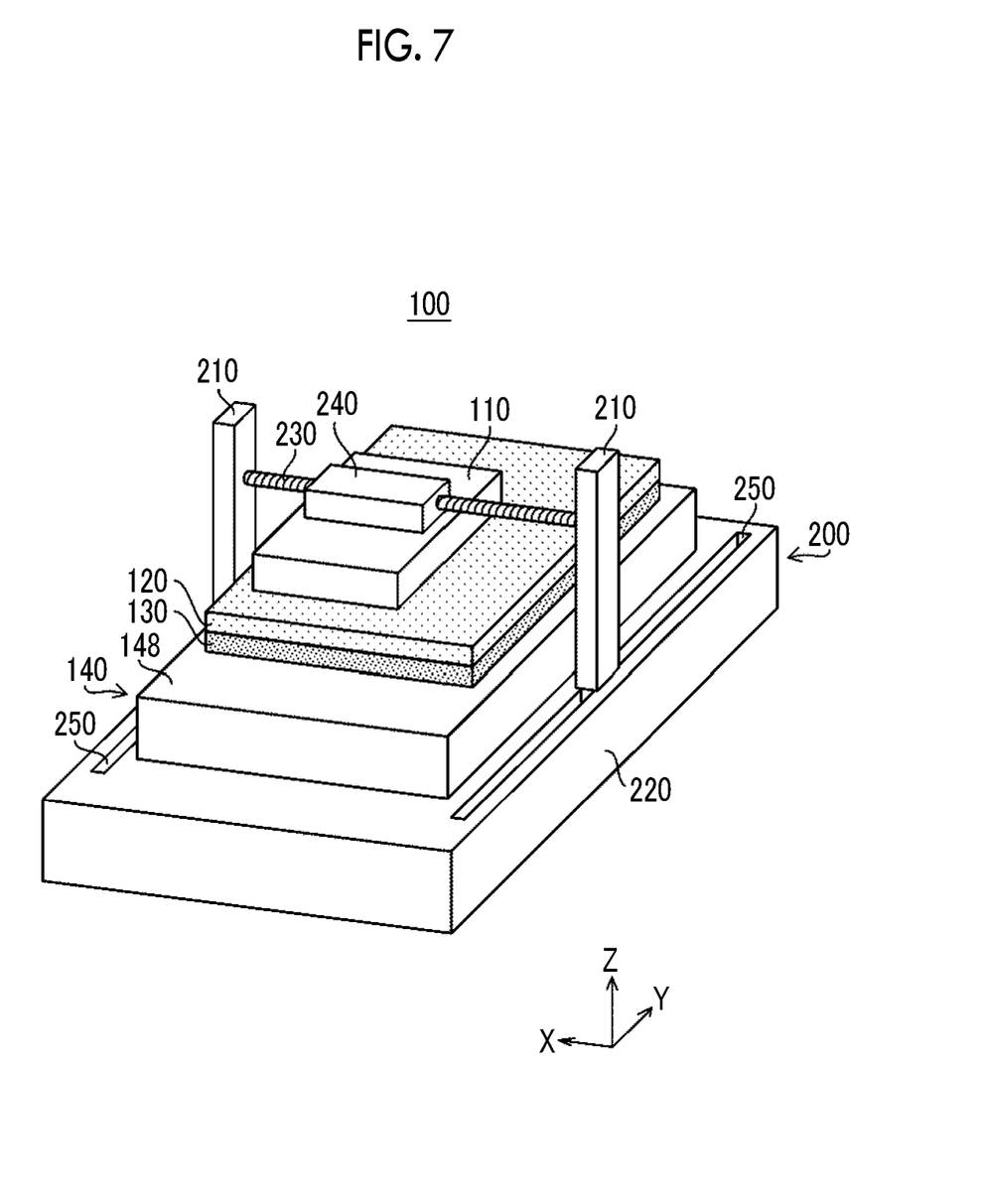
FIG. 7 is a perspective view of an image exposure device of a third embodiment.

As shown in FIG. 7, the image exposure device 100 includes the image display device 110, the ND filter 120, the fiber optic plate 130, the chassis 148 that detachably supports the film pack 140 configured with the case 144 accommodating a plurality of instant films (not shown), and the scanning portion 200.

Unlike the first embodiment, the image display device 110 of the third embodiment is two-dimensional. In addition, the image display device 110 has two-dimensionally arrayed pixels on a region having a smaller area than the exposure surface of instant film that is the photosensitive recording medium. The plurality of pixels is preferably two-dimensionally arrayed, for example, in a matrix shape.

In order to expose the instant films, like the second embodiment, the third embodiment includes the scanning portion 200. On the other hand, unlike the second embodiment, the scanning portion 200 of the third embodiment is capable of scanning the image display device 110 not only in the Y direction but also in the X direction.

For example, in pixels that are two-dimensionally arrayed in a matrix shape, in a case where the row direction is regarded as the X direction, the scanning portion is preferably scanned along both directions of the row direction (X direction) and a direction perpendicular to the row direction (X direction) (Y direction).

Therefore, the scanning portion 200 includes a ball screw 230 and a movement portion 240 including a nut that is engaged with the ball screw 230. The movement portion 240 is capable of moving in the X direction by the rotary motion of the ball screw 230. The movement portion 240 preferably has a holding portion (not shown) for holding the image display device 110.

While the scanning portion 200 scans the image display device 110 in the X direction and the Y direction, the image display device 110 is capable of sequentially exposing the instant films. A control portion, not shown, is preferably provided in order to synchronize the image displaying of the image display device 110 and the driving of the scanning portion 200.

The third embodiment is effectively applicable in the case of exposing a photosensitive recording medium having an exposure surface that is larger than the image display device 110.

Light from the pixels of the image display device 110 passes through the ND filter 120 and the fiber optic plate 130 and turns into parallel light. This parallel light reaches the instant films 142 and can be used to sequentially expose the instant films 142.

The ND filter 120 significantly reduces stray light that reaches the instant films 142. After exposure, a development process is carried out on the instant films 142. It is possible to easily understand from the above-described principle that, on the instant film 142, an image that is rarely blurred is formed and the degradation of the image quality is suppressed.

Figure 8:
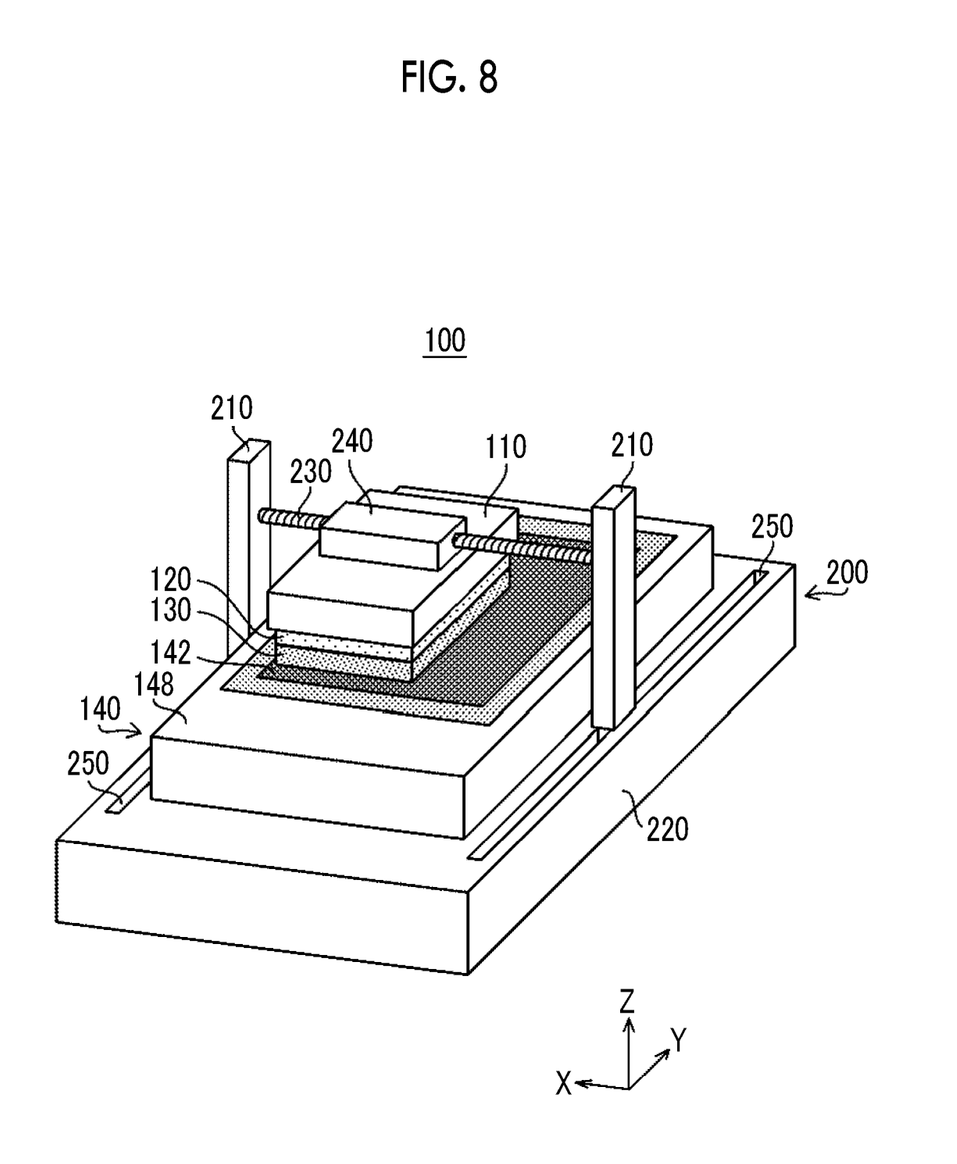
FIG. 8 is a perspective view of a modification example of the image exposure device of the third embodiment.

FIG. 8 shows a modification example of the image exposure device 100 of the third embodiment. The modification example of the image exposure device 100 includes the image display device 110, the ND filter 120, the fiber optic plate 130, the chassis 148 that detachably supports the film pack 140 configured with the case 144 accommodating the instant films 142, and the scanning portion 200.

In the modification example of the image exposure device 100, the ND filter 120 and the fiber optic plate 130 are, similar to the image display device 110, two-dimensional and smaller than the instant film 142 that is the photosensitive recording medium.

While the scanning portion 200 scans the image display device 110, the ND filter 120, and the fiber optic plate 130 in the X direction and the Y direction, the image display device 110 is capable of sequentially exposing the instant films 142. A control portion, not shown, is preferably provided in order to synchronize the image displaying of the image display device 110 and the driving of the scanning portion 200.

Light from the pixels of the image display device 110 passes through the ND filter 120 and the fiber optic plate 130 and turns into parallel light. This parallel light reaches the instant films 142 and can be used to sequentially expose the exposure surfaces 142A of the instant films 142.

The ND filter 120 significantly reduces stray light that reaches the exposure surfaces 142A of the instant films 142. After exposure, a development process is carried out on the instant films 142. It is possible to easily understand from the above-described principle that, on the instant film 142, an image that is rarely blurred is formed and the degradation of the image quality is suppressed.

The case of exposing the instant films while scanning the image display device 110 in the X direction and the Y direction has been described, but the instant films may be exposed while scanning the instant films in the X direction and the Y direction as long as the image display device 110 and the instant films 142 can be relatively scanned. That is, at least one of the image display device 110 or the instant films 142 needs to be scanned in both directions of the X direction and the Y direction.

In the second embodiment and the third embodiment, the image display device is smaller than the photosensitive recording medium. In exposure ranges to the light from the pixels of the image display device, adjacent exposure ranges may partially overlap each other. In the case of preventing the partial overlapping of the exposure ranges, there is a concern that a non-exposure region may be generated on the photosensitive recording medium. A state in which no image is formed on the photosensitive recording medium which is attributed to the non-exposure region is preferably avoided.

EXPLANATION OF REFERENCES

10: image exposure device
20: image display device
$20_{out}$: exit surface
21: pixel
22: light
22A: parallel light
22B: stray light
23: image display surface
40: photosensitive recording medium
40A: exposure surface
$40_{in}$: incident surface
50: collimation portion
$50_{in}$: incident surface
$50_{out}$: exit surface
60: absorption layer
$60_{in}$: incident surface
$60_{out}$: exit surface
70: photosensitive recording medium support portion
100: image exposure device
110: image display device
120: ND filter
130: fiber optic plate
140: film pack
142: instant film
142A: exposure surface
142B: observation surface
144: case
146: opening portion
148: chassis
200: scanning portion 210: support portion
220: support table
230: ball screw
240: movement portion
250: rail

What is claimed is:

1. An image exposure device comprising:
an image display device having pixels;
a photosensitive recording medium support portion that supports a photosensitive recording medium for recording an image of the image display device in a state in which an exposure surface of the photosensitive recording medium faces the image display device;
a collimation portion that is provided between the image display device and the photosensitive recording medium support portion and makes light from the pixels into parallel light; and
an absorption layer that is provided between the image display device and the photosensitive recording medium support portion and has a light transmittance for the light from the pixels of 0.001% or more and 50% or less.

2. The image exposure device according to claim 1, wherein the absorption layer is a neutral density filter.

3. The image exposure device according to claim 1, wherein the collimation portion is at least one selected from a slit, a fiber optic plate, a capillary plate, or a light control portion formed by laminating three or more layers of transmission members having a plurality of openings.

4. The image exposure device according to claim 1, wherein the light transmittance of the absorption layer is 20% or less.

5. The image exposure device according to claim 1, wherein, in a case where an amount of light directly reaching a location of the exposure surface of the photosensitive recording medium supported by the photosensitive recording medium support portion from the image display device is represented by A, and an amount of light indirectly reaching the location of the exposure surface of the photosensitive recording medium from the image display device is represented by B, B/A is 1/10,000 or less.

6. The image exposure device according to claim 1, wherein the image display device has two-dimensionally arrayed pixels, and
the image exposure device exposes an entire two-dimensional region of the exposure surface of the photosensitive recording medium at the same time.

7. The image exposure device according to claim 1,
wherein the image display device has one-dimensionally arrayed pixels, and
the image exposure device further comprises a scanning portion that scans at least any one of the image display device or the photosensitive recording medium supported by the photosensitive recording medium support portion in a direction perpendicular to an array direction of the pixels of the image display device.

8. The image exposure device according to claim 1,
wherein the image display device has two-dimensionally arrayed pixels on a region having a smaller area than the exposure surface of the photosensitive recording medium, and
the image exposure device further comprises a scanning portion that scans at least any one of the image display device or the photosensitive recording medium supported by the photosensitive recording medium support portion along both an array direction of the pixels of the image display device and a direction perpendicular to the array direction of the pixels.

9. The image exposure device according to claim 7,
wherein, among exposure ranges to light from the pixels, adjacent exposure ranges partially overlap each other.

10. The image exposure device according to claim 1,
wherein the image display device is attachable and detachable.

11. An image exposure method comprising:
a step of preparing an image display device having pixels;
a step of preparing a photosensitive recording medium support portion that supports a photosensitive recording medium for recording an image of the image display device in a state in which an exposure surface of the photosensitive recording medium faces the image display device; and
a step of exposing the photosensitive recording medium to light from the image display device through a collimation portion that is provided between the image display device and the photosensitive recording medium support portion and makes light from the pixels into parallel light and an absorption layer that is provided between the image display device and the photosensitive recording medium support portion and has a light transmittance for the light from the pixels of 0.001% or more and 50% or less.

* * * * *